United States Patent
Verma et al.

(10) Patent No.: US 10,854,529 B2
(45) Date of Patent: Dec. 1, 2020

(54) HIGH RESISTIVITY WAFER WITH HEAT DISSIPATION STRUCTURE AND METHOD OF MAKING THE SAME

(71) Applicant: UNITED MICROELECTRONICS CORP., Hsin-Chu (TW)

(72) Inventors: Purakh Raj Verma, Singapore (SG); Kuo-Yuh Yang, Hsinchu County (TW); Chia-Huei Lin, New Taipei (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 16/170,067

(22) Filed: Oct. 25, 2018

(65) Prior Publication Data
US 2020/0098659 A1    Mar. 26, 2020

(30) Foreign Application Priority Data
Sep. 21, 2018 (CN) ........................ 2018 1 1105431

(51) Int. Cl.
*H01L 29/06* (2006.01)
*H01L 23/367* (2006.01)
*H01L 21/48* (2006.01)

(52) U.S. Cl.
CPC ........ *H01L 23/367* (2013.01); *H01L 21/4803* (2013.01)

(58) Field of Classification Search
CPC ... H01L 23/367; H01L 21/4803; H01L 23/42; H01L 23/345; H01L 23/36; H01L 23/34; H01L 23/3677
See application file for complete search history.

(56) References Cited

U.S. PATENT DOCUMENTS

| | | | |
|---|---|---|---|
| 6,100,199 A | 8/2000 | Joshi | |
| 8,174,108 B2 | 5/2012 | O'Neill | |
| 2014/0097532 A1* | 4/2014 | Chiang | H01L 23/057 257/690 |
| 2018/0197831 A1* | 7/2018 | Kim | H01L 23/13 |
| 2019/0122951 A1* | 4/2019 | Chen | H01L 23/3677 |

* cited by examiner

*Primary Examiner* — Fernando L Toledo
*Assistant Examiner* — Valerie N Newton
(74) *Attorney, Agent, or Firm* — Winston Hsu

(57) ABSTRACT

A high resistivity wafer with a heat dissipation structure includes a high resistivity wafer and a metal structure. The high resistivity wafer includes a heat dissipation region and a device support region. The high resistivity wafer consists of an insulating material. The metal structure is only embedded within the heat dissipation region of the high resistivity wafer. The metal structure surrounds the device support region.

11 Claims, 10 Drawing Sheets

HIGH RESISTIVITY WAFER WITH HEAT DISSIPATION STRUCTURE AND METHOD OF MAKING THE SAME

BACKGROUND OF THE INVENTION

1. Field of the Invention

The present invention relates to a method and structure which can help a semiconductor structure dissipate heat, and more particularly, to a method of using a metal structure or a conductive pad on a wafer back to dissipate heat.

2. Description of the Prior Art

Semiconductor-on-insulator (SOI) substrates are widely used as substrates for radio frequency (RF) devices. For example, field effect transistors are employed as a switching device for RF signals in analog and RF applications. The RF devices on the RF SOI substrate are generally applied to wireless communication, mobile phones, etc. SOI substrates are typically employed for such applications since parasitic coupling between devices through the substrate is reduced due to the low dielectric constant of a buried insulator layer.

An SOI substrate includes an insulator layer on a silicon substrate and a semiconductor material layer on the insulator layer. In an RF circuit, the silicon layer allows active components to be wired together using any standard IC technology. With the advent of 5G cellular mobile communication, the resistivity of a traditional SOI substrate is not high enough for RF devices. Therefore, finding a way to increase the resistivity of the substrate of an RF circuit is a main objective in the semiconductor field. When the resistivity of the substrate becomes higher, however, the temperature of the substrate becomes too high and deteriorates the efficiency of the RF devices.

SUMMARY OF THE INVENTION

To solve the above-mentioned problem, the present invention provides a novel heat dissipation structure.

According to a preferred embodiment of the present invention, a high resistivity wafer with a heat dissipation structure includes a high resistivity wafer comprising a heat dissipation region and a device support region, wherein the high resistivity wafer consists of an insulating material and a metal structure embedded only within the heat dissipation region of the high resistivity wafer, wherein the metal structure surrounds the device support region.

According to another preferred embodiment of the present invention, a semiconductor structure using a conductive pad on a wafer back to dissipate heat includes a device wafer comprising a front side and a back side. A transistor is disposed at the front side, wherein the transistor comprises at least one gate structure, a source and a drain. At least one heat dissipation structure is disposed at the back side, wherein the heat dissipation structure includes a source conductive pad overlapping the source and electrically connecting to the source. A high resistivity wafer bonds to the device wafer, wherein the high resistivity wafer consists of an insulating material.

A fabricating method of a semiconductor structure with a heat dissipation structure includes providing a device wafer and a high resistivity wafer, wherein the high resistivity wafer consists of an insulating material, the device wafer comprises a device region and an edge region, a semiconductor device is disposed within the device region, the high resistivity wafer comprises a heat dissipation region and a device support region, and the heat dissipation region surrounds the device region. Next, a metal structure is formed in the high resistivity wafer, wherein the metal structure is embedded only in the heat dissipation region. After forming the metal structure, a bonding process is performed to bond the device wafer and the high resistivity wafer, making the device region entirely overlap the device support region.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 to FIG. 13 depict a fabricating method of a semiconductor structure with a heat dissipation structure according to a preferred embodiment of the present invention, wherein:

FIG. 1 depicts a sectional view of a device wafer and a high resistivity wafer;

FIG. 2 depicts a top view of a device wafer and a high resistivity wafer shown in FIG. 1;

FIG. 3 depicts a fabricating stage subsequent to FIG. 1;

FIG. 4 depicts a top view of FIG. 3 according to an example of the present invention.

FIG. 5 depicts a top view of FIG. 3 according to another example of the present invention.

FIG. 6 depicts a fabricating method of a metal structure shown in FIG. 3;

FIG. 7 depicts a modification of FIG. 3;

FIG. 8 depicts a top view of FIG. 7 according to an example of the present invention;

FIG. 9 depicts a top view of FIG. 7 according to another example of the present invention.

FIG. 10 depicts a top view of FIG. 7 according to another example of the present invention.

FIG. 11 depicts a top view of FIG. 7 according to another example of the present invention.

FIG. 12 depicts a fabricating stage subsequent to FIG. 3; and

FIG. 13 depicts a fabricating stage subsequent to FIG. 12.

FIG. 15 to FIG. 16 depict a fabricating method of a semiconductor structure using a conductive pad on a wafer back to dissipate heat according to another preferred embodiment of the present invention, wherein:

FIG. 15 depicts a semiconductor structure using a conductive pad on a wafer back to dissipate heat according to another preferred embodiment of the present invention; and FIG. 16 depicts a fabricating stage subsequent to FIG. 15.

DETAILED DESCRIPTION

Figure 4:
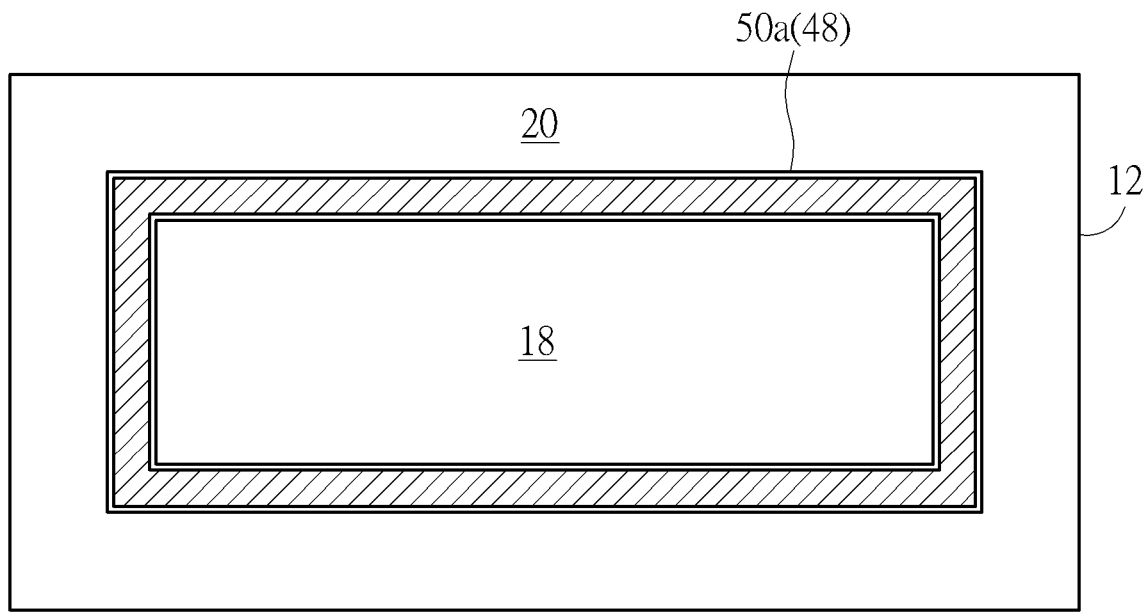
Figure 5:
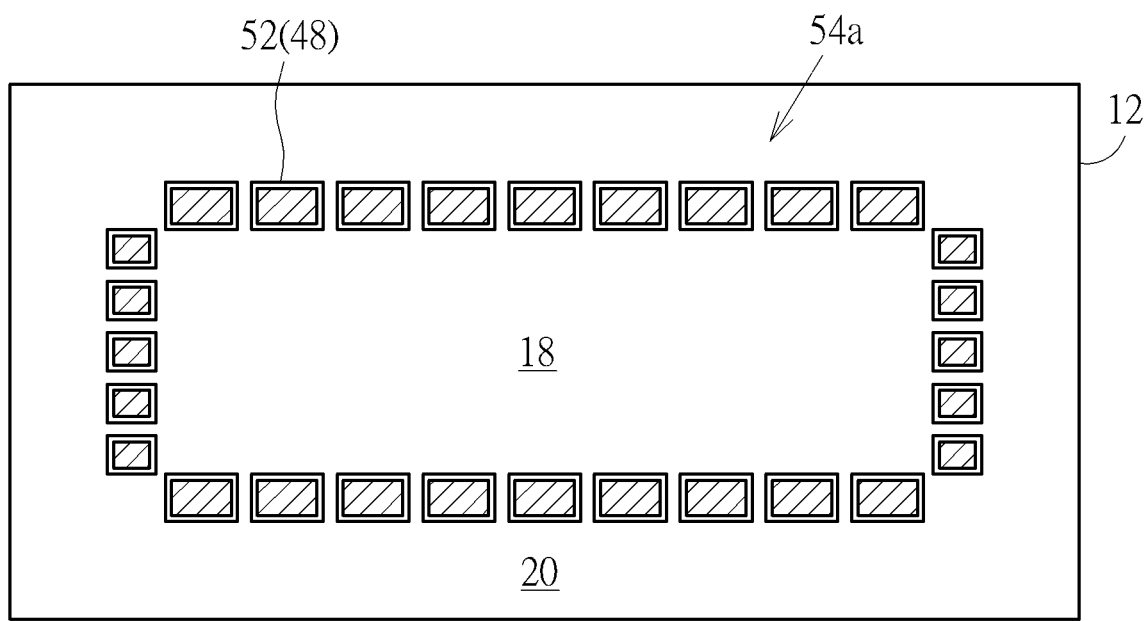
Figure 14:
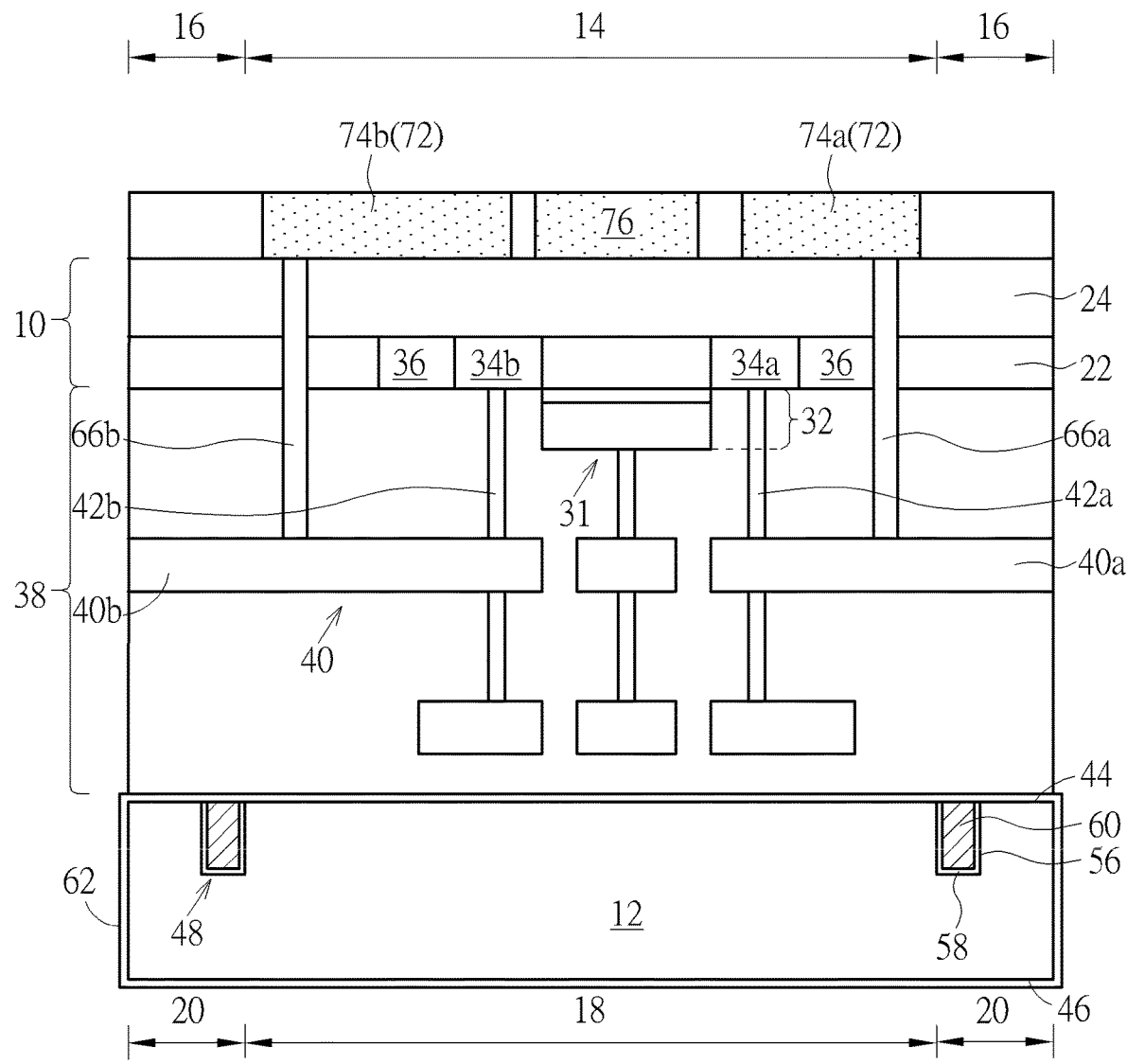
FIG. 14 depicts a semiconductor structure with a heat dissipation structure according to another preferred embodiment of the present invention.
Figure 15:
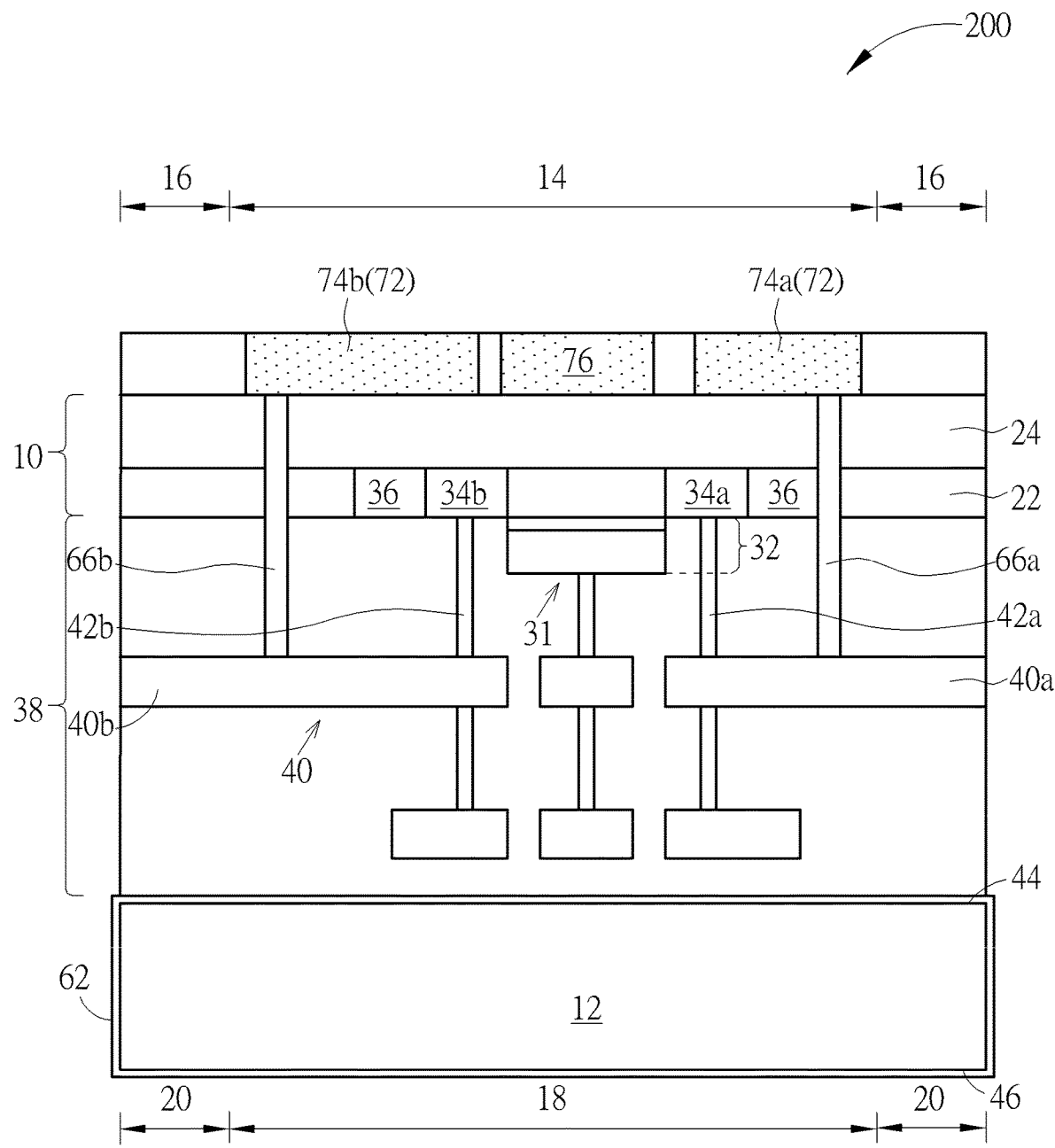
Figure 16:
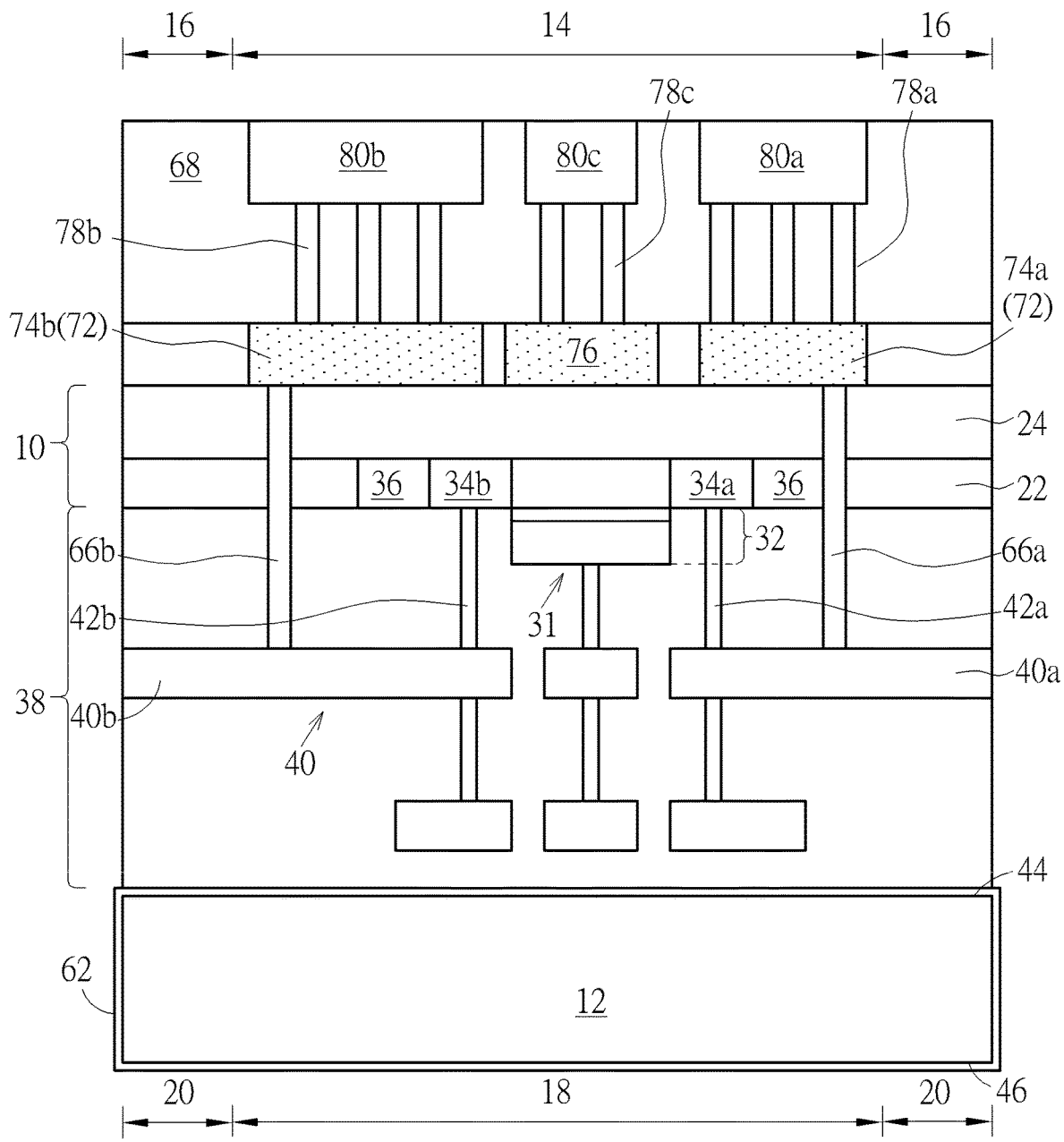

FIG. 1 to FIG. 13 depict a fabricating method of a semiconductor structure with a heat dissipation structure according to a preferred embodiment of the present invention. FIG. 2 depicts a top view of a device wafer and a high resistivity wafer in FIG. 1. FIGS. 4-5 depict a top view of FIG. 3 according to numerous examples. FIGS. 8-11 depict a top view of FIG. 7 according to numerous examples. FIG. 14 depicts a semiconductor structure with a heat dissipation structure according to another preferred embodiment of the present invention, wherein elements in FIG. 14 which are substantially the same as those in the embodiment of FIG. 1 to FIG. 13 are denoted by the same reference numerals; an accompanying explanation is therefore omitted. FIG. 15 to FIG. 16 depict a fabricating method of a semiconductor structure using a conductive pad on a wafer back to dissipate heat according to another preferred embodiment of the present invention, wherein elements in FIG. 15 and FIG. 16 which are substantially the same as those in the embodiment of FIG. 1 to FIG. 13 are denoted by the same reference numerals; an accompanying explanation is therefore omitted.

Figure 1:
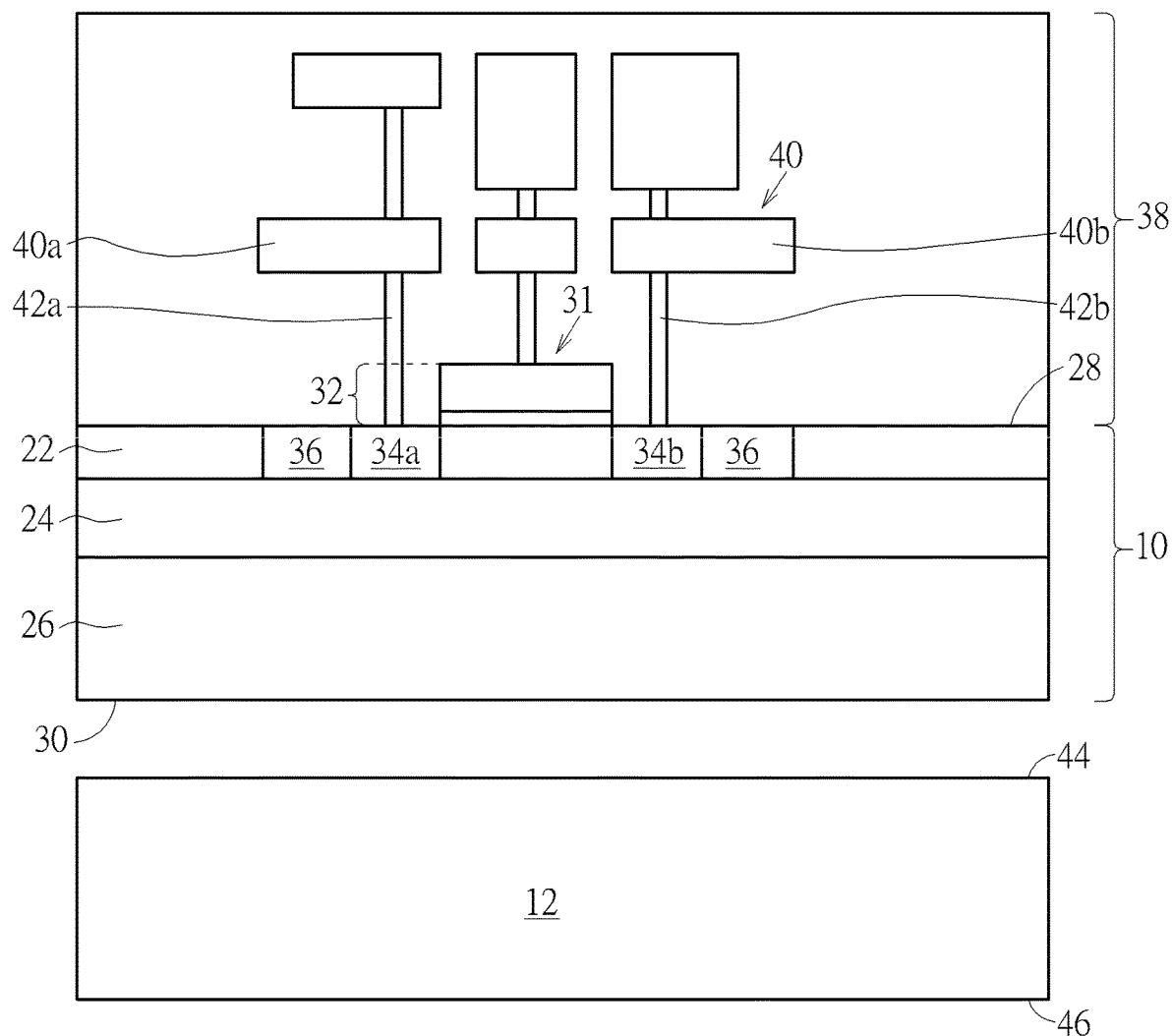
Figure 2:
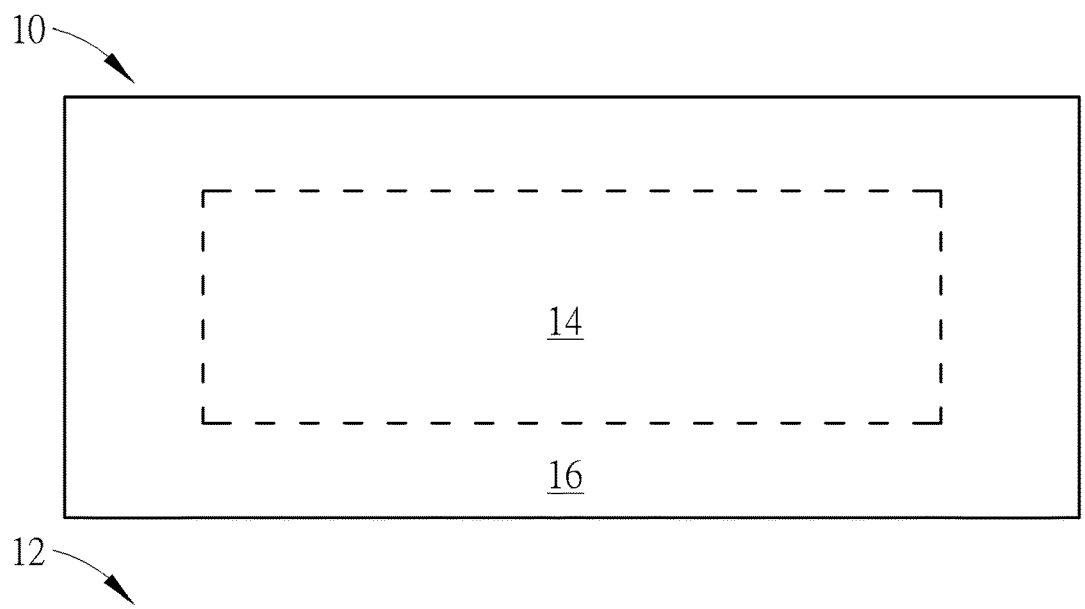
Figure 2:
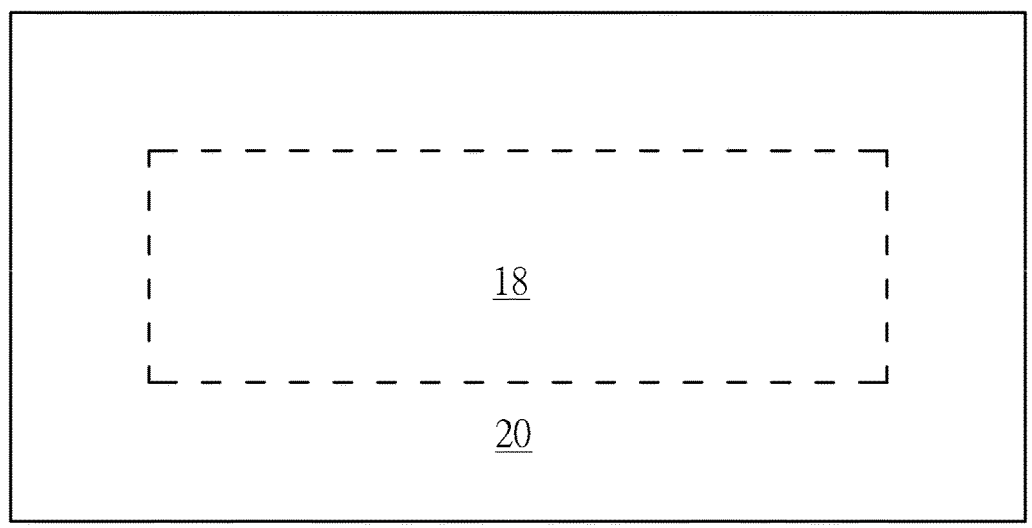

As shown in FIG. 1 and FIG. 2, a device wafer 10 and a high resistivity wafer 12 are provided. The device wafer 10 includes a device region 14 and an edge region 16. The edge region 16 surrounds the device region 14. The high resistivity wafer 12 includes a device support region 18 and a heat dissipation region 20. The heat dissipation region 20 surrounds the device support region 18. After a bonding process which is performed afterwards, the device region 14 will entirely overlap the device support region 18, and the heat dissipation region 20 will overlap the edge region 16.

The device wafer 10 includes a conductive silicon layer 22, a silicon oxide layer 24 and a silicon substrate 26. The silicon oxide layer 24 is disposed between the conductive silicon layer 22 and the silicon substrate 26. Moreover, the device wafer 10 includes a first front side 28 and a first back side 30. A semiconductor device such as a transistor 31 is disposed at the device region 14 on the first front side 28. The transistor 31 includes a gate structure 32 and two source/drain doping regions 34a/34b. The source/drain doping regions 34a/34b are respectively disposed in the conductive silicon layer 22 at two sides of the gate structure 32. A shallow trench isolation 36 is disposed around the transistor 31 and in the conductive silicon layer 22. Furthermore, no semiconductor device is disposed within the edge region 16. An interlayer dielectric 38 covers and contacts the first front side 28 of the device wafer 10. A metal connection 40 is disposed within the interlayer dielectric 38. The metal connection 40 is formed by numerous metal layers such as metal layers 40a/40b. Conductive plugs 42a/42b are respectively disposed on the source/drain doping regions 34a/34b. The conductive plug 42a contacts the metal layer 40a, and the conductive plug 42b contacts the metal layer 40b.

The high resistivity wafer 12 includes a second front side 44 and a second back side 46. The second front side 44 is opposed to the second back side 46. The high resistivity wafer 12 consists of an insulating material. In other words, the high resistivity wafer 12 only includes the aforesaid insulating material. According to a preferred embodiment of the present invention, the insulating material includes glass, quartz, silicon nitride or other insulating materials. The resistivity of the high resistivity wafer 12 is preferably higher than $10^9$ Ωm, i.e. the resistivity of the insulating material should be greater than $10^9$ Ωm. Moreover, the coefficient of thermal expansion of the insulating material is close to the coefficient of the thermal expansion of silicon. Conventionally, the wafer used in the semiconductor field has a resistivity between 30 and 200 Ωm, i.e. the conventional wafer has a resistivity smaller than 200 Ωm. The high resistivity wafer 12 has a resistivity which is much greater than a conventional wafer. Therefore, the high resistivity wafer 12 is defined as high resistive.

Figure 3:
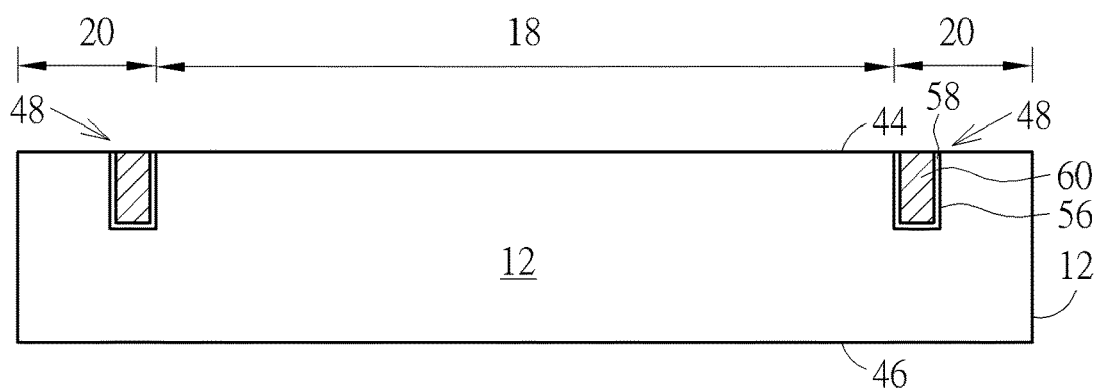

As shown in FIG. 3, a metal structure 48 is formed to be embedded in the high resistivity wafer 12. The metal structure 48 is only disposed in the heat dissipation region 20. The metal structure 48 may include a closed metal ring or a ring structure formed by numerous metal pieces. As shown in FIG. 4, the metal structure 48 includes a closed metal ring 50a surrounding the device support region 18. As shown in FIG. 5, the metal structure 48 includes a ring structure 54a formed by numerous metal pieces 52. The ring structure 54a surrounds the device support region 18.

Figure 6:
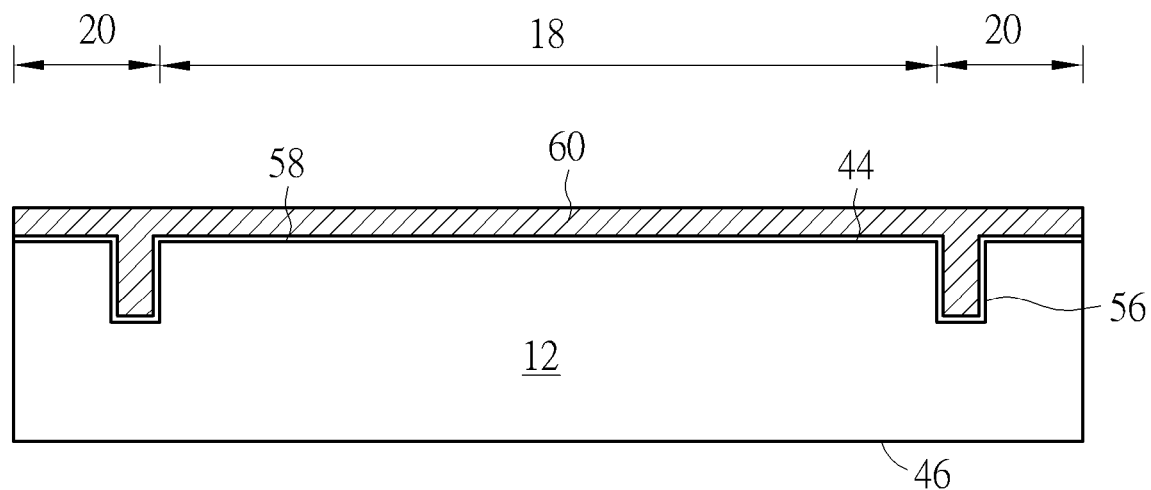

As shown in FIG. 6, the fabricating method of the metal structure 48 including the closed metal ring 50a and the metal pieces 52 may include forming a trench 56 in the heat dissipation region 20 on the second front side 44 of the high resistivity wafer 12, so that the opening of the trench 56 faces the second front side 44. Next, an adhesion layer 58 is formed to cover the trench 56 and the second front side 44 of the high resistivity wafer 12. Later, a metal layer 60 is formed to fill in the trench 56 and cover the second front side 44 of the high resistivity wafer 12. Referring to FIG. 3 again, a planarization process is performed to remove part of the adhesion layer 58 and part of the metal layer 60 to align a top surface of the adhesion layer 58 in the trench, a top surface of the metal layer 60 and the second front side 44 of the high resistivity wafer 12. The metal structure 48 includes copper, aluminum or tungsten. The adhesion layer 58 includes tantalum nitride, titanium nitride or molybdenum nitride.

Figure 7:
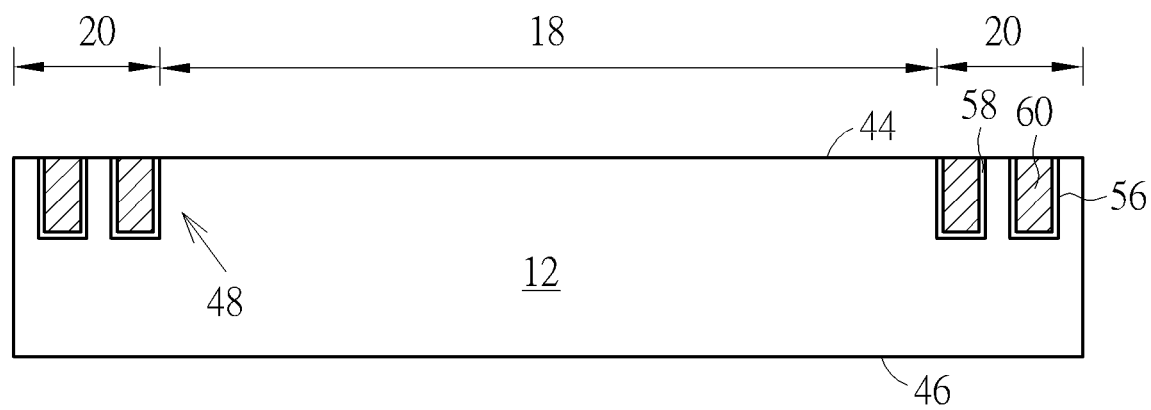
Figure 9:
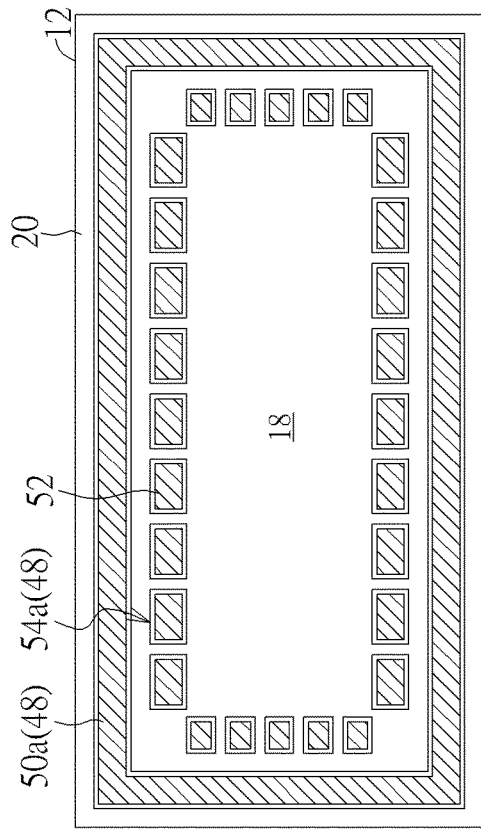
Figure 11:
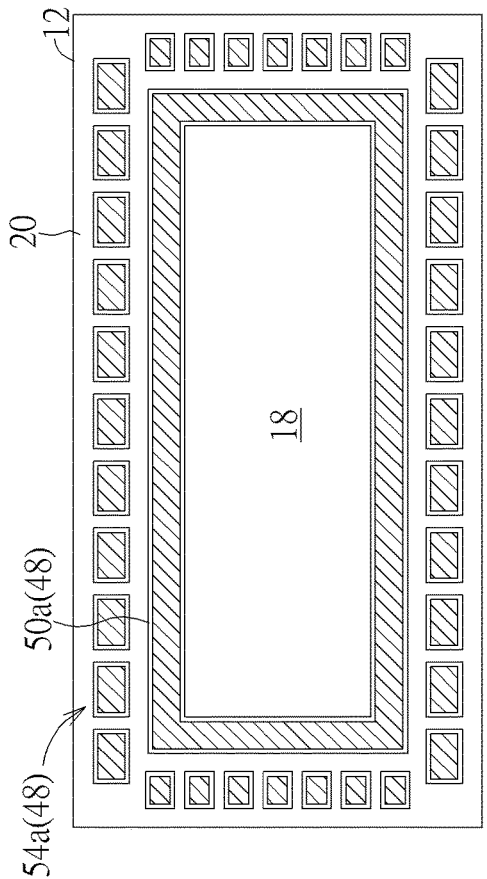
Figure 8:
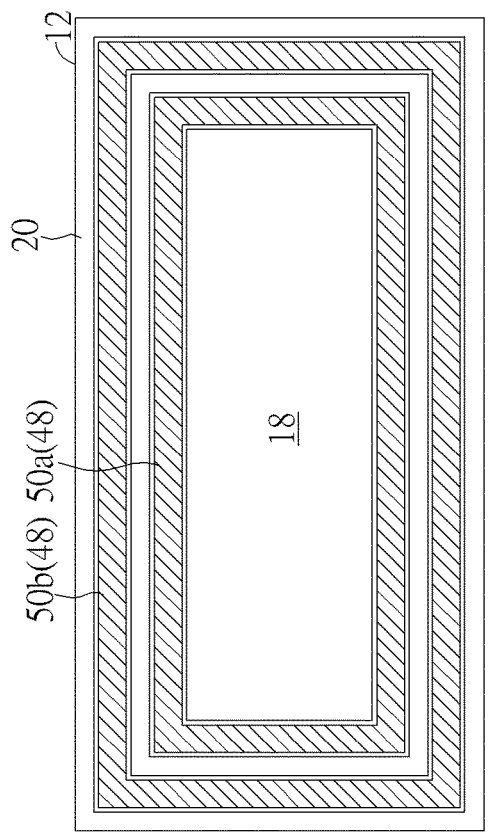
Figure 10:
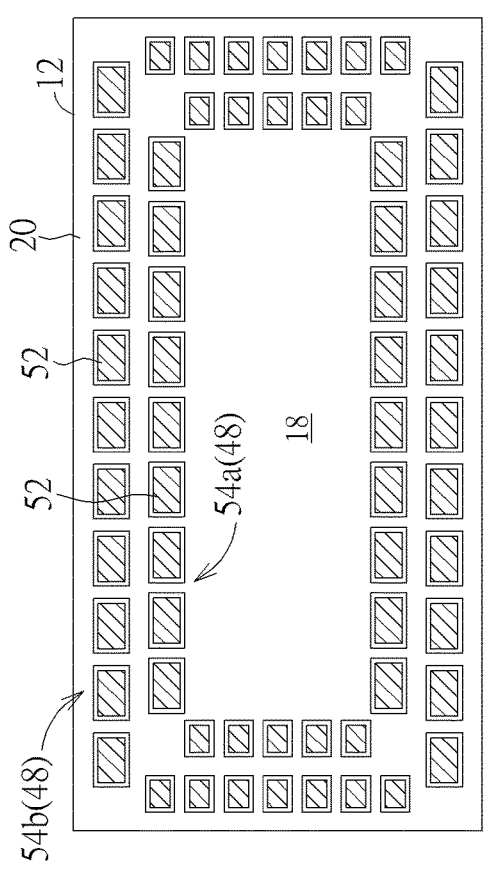

According to a preferred embodiment of the present invention, the metal structure 48 may include numerous closed metal rings or numerous ring structures formed by numerous metal pieces. Moreover, the metal structure 48 can also be formed by numerous closed metal rings and numerous ring structures. The fabricating method of the metal structure 48, the metal rings and the ring structures are the same as those disclosed in FIG. 6, and therefore are omitted here. As shown in FIG. 7 and in FIG. 8, the metal structure 48 can be formed by two closed metal rings 50a/50b. The closed metal rings 50a/50b together surround the device support region 18. As shown in FIG. 7 and in FIG. 9, the metal structure 48 is formed by a closed metal ring 50a surrounding a ring structure 54a formed by numerous metal pieces 52. The closed metal ring 50a and the ring structure 54a together surround the device support region 18. As shown in FIG. 7 and in FIG. FIG. 10, the metal structure 48 is formed by two ring structures 54a/54b respectively including numerous metal pieces 52. The two ring structures 54a/54b together surround the device support region 18. As shown in FIG. 7 and in FIG. 11, the metal structure 48 can be formed by a ring structure 54a surrounding a closed metal ring 50a. The ring structure 54a includes numerous metal pieces 52. The ring structure 54a and the closed metal ring 50a together surround the device support region 18. Although the total numbers of the closed metal ring and the ring structures are one or two in this embodiment, they are not limited to this number. The total number can be altered based on different requirements. Moreover, according to another preferred embodiment of the present invention, the depth of closed metal rings 50a/50b or the depth of the ring structures 54a/54b which are nearer the device support region 18 is deeper than the depth of closed metal rings 50a/50b or the depth of the ring structures 54a/54b which are further from the device support region 18. Furthermore, according to another preferred embodiment of the present invention, when the total number of the closed metal ring and the ring structures are not fewer than two, there can be metal traces arranged in a radial-liked disposition between the closed metal ring 50a/50b or the ring structures 54a/54b to connect the inner metal ring/ring structure to the outer metal ring/ring structure.

Figure 12:
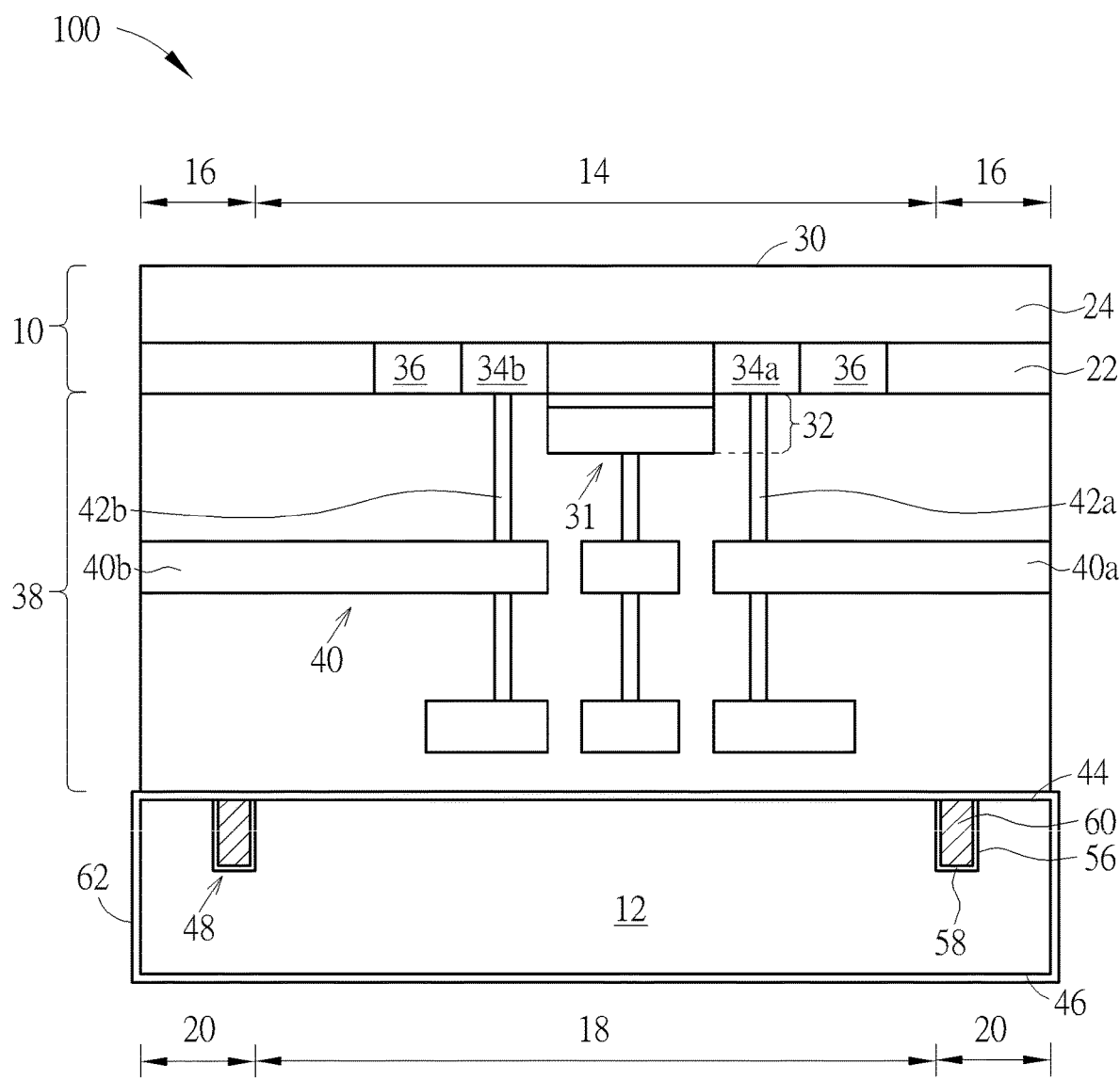

As shown in FIG. 12, after forming the metal structure 48, a bonding process is performed to bond the device wafer 10 and the high resistivity wafer 12. After the bonding process, the device region 14 and the device support region 18 are entirely overlapped, and the heat dissipation region 20 overlaps the edge region 16. According to a preferred embodiment of the present invention, the heat dissipation region 20 entirely overlaps the edge region 16. The bonding process includes forming a dielectric layer 62 which contacts and encapsulates the high resistivity wafer 12. The dielectric layer 62 is preferably formed by silicon oxide. Next, the dielectric layer 62 on the second front side 44 and the interlayer dielectric 38 on the first front side 28 are bonded together. After the bonding process, the silicon substrate 26 is entirely removed by taking the silicon oxide layer 24 as a stop layer. The back side of the silicon oxide layer 24 serves as the first back side 30 of the device wafer 10. At this point, a high resistivity wafer with a heat dissipation structure 100 of the present invention is completed.

Figure 13:
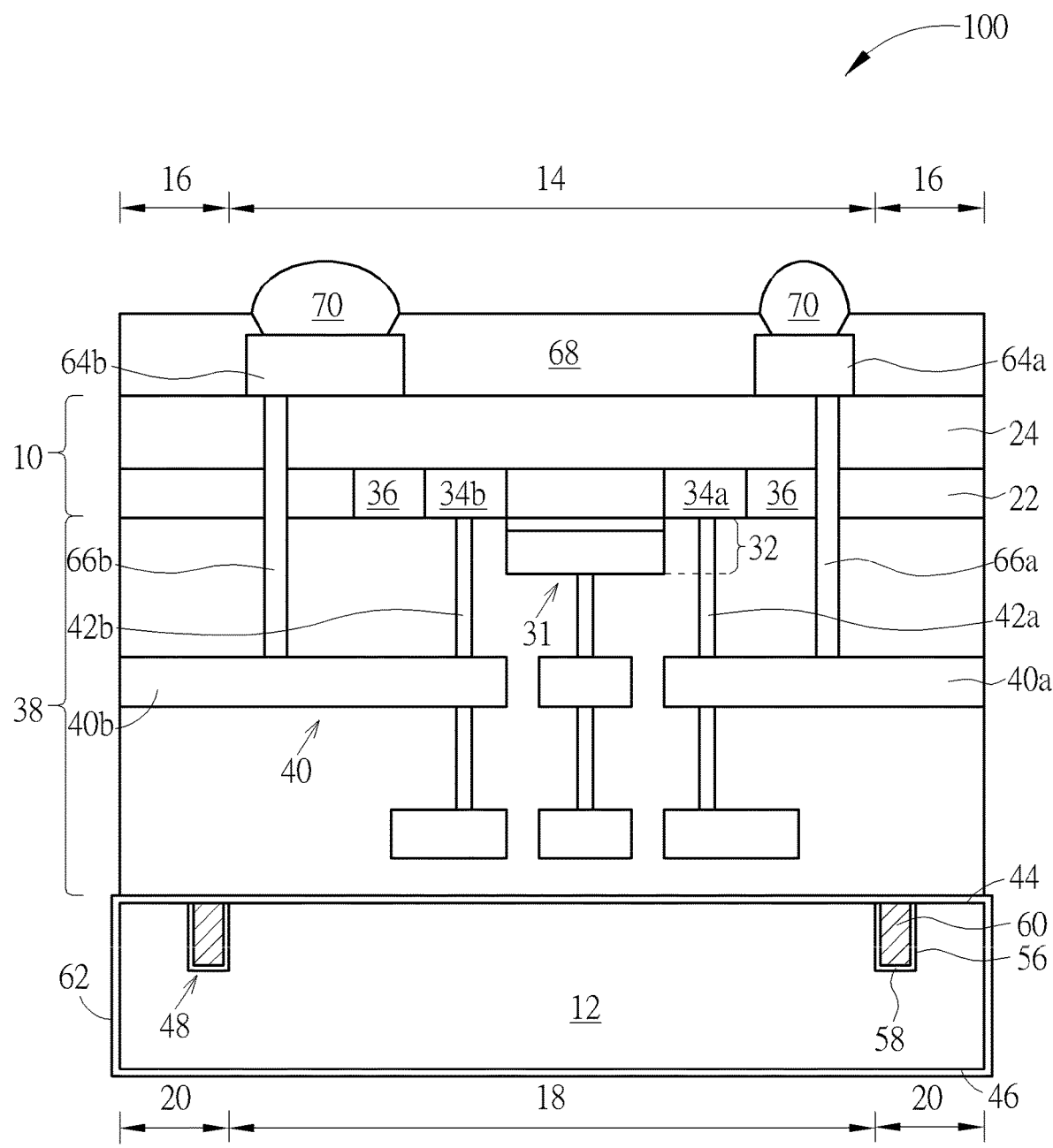

As shown in FIG. 13, after forming the high resistivity wafer with a heat dissipation structure 100, a conductive bump formation process can be performed. The conductive bump formation process may include forming at least one conductive pad such as two conductive pads 64a/64b shown in FIG. 13 on the back side of the silicon oxide layer 24. The back side of the silicon oxide layer 24 is the same as the first back side 30 of the device wafer 10. Each of the conductive pads 64a/64b respectively electrically connects to the metal interconnection 40 in the interlayer dielectric layer 38 through via plugs 66a/66b. The metal layer 40a contacts the conductive pad 42a and the metal layer 40b contacts the conductive pad 42b; therefore, the conductive pads 64a/64b electrically connect to the source/drain doping regions 34a/34b through the metal connection 40.

Later, a protective layer 68 is formed to cover the conductive pads 64a/64b. Next, two openings are formed within the protective layer 68 to expose the conductive pads 64a/64b. After that, conductive bumps 70 are formed to respectively contact the contact pads 64a/64b. The material of the conductive pads 64a/64b and the conductive bumps 70 may be titanium (Ti), tantalum (Ta), aluminum (Al), tungsten (W) or copper (Cu), etc.

As shown in FIG. 12, a high resistivity wafer with a heat dissipation structure of the present invention includes a high resistivity wafer 12, a device wafer 10 and a metal structure 48. The high resistivity wafer 12 includes a heat dissipation region 20 and a device support region 18. The high resistivity wafer 12 consists of an insulating material. The metal structure 48 is only embedded within the heat dissipation region 20 of the high resistivity wafer 12. The metal structure 48 surrounds the device support region 18. The device wafer 10 covers the high resistivity wafer 12. The device wafer 10 includes a device region 14 and an edge region 16. No semiconductor device is disposed within the edge region 16. Furthermore, the device wafer 10 includes a first front side 28 and a first back side 30. A semiconductor device is disposed within the device region 14 on the first front side 28. The semiconductor device can be a transistor 31. The transistor 31 includes a gate structure 32 and two source/drain doping regions 34a/34b. The source/drain doping regions 34a/34b are respectively disposed in the conductive silicon layer 22 at two sides of the gate structure 32. A shallow trench isolation 36 is disposed in the conductive silicon layer 22 and surrounds the transistor 31. An interlayer dielectric 38 covers and contacts the first front side 28 of the device wafer 10. A metal connection 40 is disposed within the interlayer dielectric 38. The high resistivity wafer 12 bonds to the device wafer 10 by bonding the interlayer dielectric 38 and the dielectric layer 62. The device region 14 and the device support region 18 are entirely overlapped, and the heat dissipation region 20 overlaps the edge region 16. According to a preferred embodiment of the present invention, the heat dissipation region 20 entirely overlaps the edge region 16.

Due to the high resistivity of the high resistivity wafer, the efficiency of the radio frequency device is increased; however, this high resistivity may lead to the wafer overheating. Therefore, the metal structure embedded in the high resistivity wafer is used as a heat dissipation structure. Because metal has good thermal conductivity, the heat accumulated in the high resistivity wafer can be conducted. Furthermore, the metal structure does not overlap the device region; therefore, the property of the semiconductor device is not influenced by the metal structure.

According to another preferred embodiment of the present invention, after the step performed in FIG. 12, a step shown in FIG. 14 can be performed. As shown in FIG. 14, at least one heat dissipation structure 72 such as a source conductive pad 74a and a drain conductive pad 74b is formed on the first back side 30 of the device wafer. The source conductive pad 74a electrically connects to the metal layer 40a through the via plug 66a in the interlayer dielectric 38. The drain conductive pad 74b electrically connects to the metal layer 40b through the via plug 66b in the interlayer dielectric 38. Because the metal layer 40a contacts the conductive plug 42a, and the metal layer 40b contacts the conductive plug 42b, the source conductive pad 74a electrically connects to the source/drain doping region 34a, and the drain conductive pad 74b electrically connects to the source/drain doping region 34b. The source/drain doping region 34a serves as a source and the source/drain doping region 34b serves as a drain during operation. It is noteworthy that the source conductive pad 74a not only covers the shallow trench isolation 36 but also extends to overlap the source/drain doping region 34a serving as a source. The drain conductive pad 74b not only covers the shallow trench isolation 36 but also extends to overlap the source/drain doping region 34b serving as a drain. Besides, a wafer back gate 76 is formed on the first back side 30. The source conductive pad 74a, the drain conductive pad 74b and the wafer back gate 76 may be titanium (Ti), tantalum (Ta), aluminum (Al), tungsten (W) or copper (Cu), etc.

According to another preferred embodiment of the present invention, the metal structure in the high resistivity wafer can be omitted, only the source conductive pad 74a and the drain conductive pad 74b on the first back side 30 are formed. The fabricating process of this embodiment can be performed by the steps illustrated in FIG. 1 to FIG. 13, only omitting the step of forming the metal structure 48 in FIG. 3. As shown in FIG. 15, a semiconductor structure using a conductive pad on a wafer back to dissipate heat 200 of the present invention includes a device wafer 10. The device wafer 10 includes a first front side 28 and a first back side 30. A transistor 31 is disposed at the first front side 28. The transistor 31 includes a gate structure 32 and two source/drain doping regions 34a/34b. The source/drain doping region 34a serves as a source and the source/drain doping region 34b serves as a drain during operation. A shallow trench isolation 36 is disposed around the transistor 31. At least one heat dissipation structure 72 is disposed at the first back side 30 of the device wafer 10. The heat dissipation structure 72 includes a source conductive pad 74a and a drain conductive pad 74b. The source conductive pad 74a not only covers the shallow trench isolation 36 but also extends to overlap the source/drain doping region 34a serving as a source. The drain conductive pad 74b not only covers the shallow trench isolation 36 but also extends to overlap the source/drain doping region 34b serving as a drain.

An interlayer dielectric 38 covers and contacts the first front side of the device wafer 10. A metal connection 40 is disposed within the interlayer dielectric 38. The metal connection 40 is formed by numerous metal layer such as metal layers 40a/40b. Conductive plugs 42a/42b are respectively disposed on the source/drain doping region 34a/34b. The conductive plug 42a contacts the metal layer 40a, and the conductive plug 42b contacts the metal layer 40b. The source conductive pad 74a electrically connects to the metal layer 40a through the via plug 66a. The drain conductive pad 74b electrically connects to the metal layer 40b through the via plug 66b. The metal layer 40a contacts the conductive pad 42a and the metal layer 40b contacts the conductive pad 42b; therefore, the conductive pads 64a electrically connect to the source/drain doping regions 34a serving as a source, and the conductive pads 64b electrically connect to the source/drain doping regions 34b serving as a drain.

A high resistivity wafer 12 is encapsulated by a dielectric layer 62. The high resistivity wafer 12 bonds to the device wafer 10 by bonding the interlayer dielectric 38 and the dielectric layer 62. The high resistivity wafer 12 consists of an insulating material. The insulating material includes glass, quartz, silicon nitride or other insulating materials. The resistivity of the high resistivity wafer 12 is preferably higher than $10^9$ Ωm, i.e. the resistivity of the insulating material should be greater than $10^9$ Ωm.

The areas of both the source conductive pad and the drain conductive pad of the present invention present are increased to respectively overlap the source and the drain. In this way, the heat formed by the source and drain can be conducted to the outside through the source conductive pad and the drain conductive pad.

As shown in FIG. 16, based on different requirements, conductive plugs 78a/78b/78c and conductive pads 80a/80b/80c can be formed on the source conductive pad 74a, the drain conductive pad 74b and a wafer back gate 76. The conductive plugs 78a/78b/78c and the conductive pads 80a/80b/80c help to further conduct the heat on the source conductive pad 74a, the drain conductive pad 74b and the wafer back gate 76 to the outside.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A high resistivity wafer with a heat dissipation structure, comprising:

a high resistivity wafer comprising a heat dissipation region and a device support region, wherein the high resistivity wafer consists of an insulating material; and
   a metal structure embedded only within the heat dissipation region of the high resistivity wafer, wherein the metal structure surrounds the device support region
   a device wafer covering the high resistivity wafer, the device wafer comprising a device region, and an edge region, wherein no device is disposed within the edge region; and
   a semiconductor device disposed within the device region, wherein the device region entirely overlaps the device support region, and the edge region overlaps the heat dissipation region.

2. The high resistivity wafer with a heat dissipation structure of claim 1, wherein the device support region of the high resistivity wafer has no device therein.

3. The high resistivity wafer with a heat dissipation structure of claim 1, wherein the metal structure comprises a first closed metal ring and the first closed metal ring surrounds the device support region.

4. The high resistivity wafer with a heat dissipation structure of claim 3, wherein the metal structure further comprises a second closed metal ring surrounding the first closed metal ring.

5. The high resistivity wafer with a heat dissipation structure of claim 3, wherein the metal structure further comprises a plurality of metal pieces, wherein the plurality of metal pieces are arranged in a ring structure surrounding the first closed metal ring.

6. The high resistivity wafer with a heat dissipation structure of claim 1, wherein the metal structure comprises a plurality of first metal pieces, wherein the plurality of first metal pieces are discretely and separately arranged in a first ring structure surrounding the device support region.

7. The high resistivity wafer with a heat dissipation structure of claim 6, wherein the metal structure further comprises a plurality of second metal pieces, wherein the plurality of second metal pieces are arranged in a second ring structure surrounding the first ring structure.

8. The high resistivity wafer with a heat dissipation structure of claim 6, wherein the metal structure further comprises a closed metal ring surrounding the first ring structure.

9. The high resistivity wafer with a heat dissipation structure of claim 1, wherein the metal structure comprises copper, aluminum or tungsten.

10. The high resistivity wafer with a heat dissipation structure of claim 1, wherein the insulating material comprises glass, quartz or silicon nitride.

11. The high resistivity wafer with a heat dissipation structure of claim 1, wherein the resistivity of the insulating material is greater than $10^9$ Ωm.

* * * * *